US012348656B2

(12) United States Patent
Won et al.

(10) Patent No.: US 12,348,656 B2
(45) Date of Patent: Jul. 1, 2025

(54) ELECTRONIC DEVICE HAVING FLEXIBLE DISPLAY MODULE

(71) Applicant: Samsung Electronics Co., Ltd., Suwon-si (KR)

(72) Inventors: Jaehong Won, Suwon-si (KR); Hosoon Lee, Suwon-si (KR); Jinwan An, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 229 days.

(21) Appl. No.: 18/152,467

(22) Filed: Jan. 10, 2023

(65) Prior Publication Data

US 2023/0336651 A1     Oct. 19, 2023

Related U.S. Application Data

(63) Continuation of application No. PCT/KR2022/020961, filed on Dec. 21, 2022.

(30) Foreign Application Priority Data

Apr. 14, 2022   (KR) .................. 10-2022-0046268
Jul. 22, 2022    (KR) .................. 10-2022-0091275

(51) Int. Cl.
*G06F 1/16*     (2006.01)
*H04M 1/02*    (2006.01)

(52) U.S. Cl.
CPC ........ *H04M 1/0268* (2013.01); *G06F 1/1652* (2013.01); *H04M 1/0216* (2013.01)

(58) Field of Classification Search
CPC .... H04M 1/0268; H04M 1/0216; H04M 1/02; C03C 15/00; C03C 17/00; C03C 23/00;
(Continued)

(56) References Cited

U.S. PATENT DOCUMENTS 10,020,462  B1 *   7/2018   Ai ..................... H10K 50/841
10,439,164  B2 *  10/2019   Song ................. G02F 1/133308
(Continued)

FOREIGN PATENT DOCUMENTS

CN     110649087 A      1/2020
CN     114333584 A      4/2022
(Continued)

OTHER PUBLICATIONS

International Search Report dated Feb. 8, 2023, issued in International Patent Application No. PCT/KR2022/020961.
(Continued)

*Primary Examiner* — Rockshana D Chowdhury
(74) *Attorney, Agent, or Firm* — Jefferson IP Law, LLP

(57) ABSTRACT

An electronic device including a flexible display module is provided. The flexible display module includes a patterned window. The patterned window includes a plurality of patterned portions. The plurality of patterned portions each have at least three corners having a predetermined curvature. One or more first corners formed on an upper side of the patterned window have a first curvature, and one or more second corners formed on a lower side of the patterned window have a second curvature, the first curvature and the second curvature being different from each other.

21 Claims, 21 Drawing Sheets

(58) Field of Classification Search
CPC .... G06F 1/1637; G06F 1/1641; G06F 1/1681; G06F 1/1652; G02F 1/133305; G02F 2201/50; G09F 9/30; H10K 50/80
See application file for complete search history.

(56) References Cited

U.S. PATENT DOCUMENTS

| | | | |
|---|---|---|---|
| 10,494,549 B2 | 12/2019 | Kim et al. | |
| 11,320,866 B2* | 5/2022 | Sunwoo | G06F 1/1656 |
| 11,481,003 B2 | 10/2022 | Cho et al. | |
| 11,647,644 B2* | 5/2023 | Sunwoo | H10K 59/12 |
| | | | 257/40 |
| 11,758,752 B2* | 9/2023 | Hyun | H10K 59/871 |
| | | | 257/88 |
| 2015/0195936 A1* | 7/2015 | Park | G02F 1/1333 |
| | | | 428/161 |
| 2017/0262022 A1 | 9/2017 | Choi et al. | |
| 2018/0062090 A1 | 3/2018 | Kim et al. | |
| 2018/0201540 A1* | 7/2018 | Sheen | C03C 17/245 |
| 2020/0004295 A1 | 1/2020 | Paek et al. | |
| 2020/0183457 A1 | 6/2020 | Youn et al. | |
| 2020/0201033 A1* | 6/2020 | Song | H10K 59/879 |
| 2021/0120691 A1* | 4/2021 | Su | G02F 1/133305 |
| 2022/0294886 A1 | 9/2022 | Seo et al. | |
| 2023/0018777 A1 | 1/2023 | Park et al. | |
| 2024/0079442 A1* | 3/2024 | Nguyen | G06F 1/1652 |

FOREIGN PATENT DOCUMENTS

| | | |
|---|---|---|
| KR | 10-2010-0102921 A | 9/2010 |
| KR | 10-2020-0087481 A | 7/2020 |
| KR | 10-2146730 B1 | 8/2020 |
| KR | 10-2162567 B1 | 10/2020 |
| KR | 10-2021-0019803 A | 2/2021 |
| KR | 10-2021-0029268 A | 3/2021 |
| KR | 10-2021-0047616 A | 4/2021 |
| KR | 10-2021-0081485 A | 7/2021 |
| KR | 10-2021-0085131 A | 7/2021 |
| KR | 10-2021-0103027 A | 8/2021 |
| KR | 10-2022-0013766 A | 2/2022 |
| KR | 10-2022-0017583 A | 2/2022 |
| KR | 10-2022-0021939 A | 2/2022 |
| KR | 10-2369002 B1 | 3/2022 |
| KR | 10-2590307 B1 | 10/2023 |
| KR | 10-2592992 B1 | 10/2023 |

OTHER PUBLICATIONS

Extended European Search Report dated Feb. 17, 2025 issued in counterpart European Patent Application No. 22937584.5.

* cited by examiner

ELECTRONIC DEVICE HAVING FLEXIBLE DISPLAY MODULE

CROSS-REFERENCE TO RELATED APPLICATION(S)

This application is a continuation application, claiming priority under § 365(c), of an International application No. PCT/KR2022/020961, filed on Dec. 21, 2022, which is based on and claims the benefit of a Korean patent application number 10-2022-0046268, filed on Apr. 14, 2022, in the Korean Intellectual Property Office, and of a Korean patent application number 10-2022-0091275, filed on Jul. 22, 2022, in the Korean Intellectual Property Office, the disclosure of each of which is incorporated by reference herein in its entirety.

BACKGROUND

1. Field

The disclosure relates to an electronic device having a flexible display module.

2. Description of Related Art

Along with the recent development of electronics, information and telecommunication technologies, a variety of functions are being recently integrated into a single mobile communication device or electronic device. For example, a smart phone may provide various functions of a sound playback device, an imaging device, a personal digital assistant or the like as well as a communication function, and thus, a variety of functions may be implemented in the smart phone by additional installation of applications.

Further, as personal or portable communication devices such as e.g., smart phones are being used in more common, the users' demands for enhanced portability and convenience of usage are also increasing. For example, a touch screen display may provide a virtual keypad which serves as a screen, e.g., an output device to output visual information to a user and replaces a conventional mechanical input device (e.g., a button input device). As such, the portable communication device or the electronic device can be miniaturized while providing the same or more improved usability (e.g., a larger screen). On the other hand, as flexible, e.g., foldable or rollable displays become commercially available, it is expected that portability and convenience in use of those electronic devices will further improve.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device with improved impact resistance and pattern visibility of a display module.

Additional aspects will be set forth in part in the description which follows and, in part, will be apparent from the description, or may be learned by practice of the presented embodiments.

In accordance with an aspect of the disclosure, an electronic device including a flexible display module is provided, wherein the flexible display module includes a patterned window, the patterned window includes a plurality of patterned portions, and the plurality of patterned portions each have at least three corners having a predetermined curvature, wherein one or more first corners formed on an upper side of the patterned window have a first curvature, and one or more second corners formed on a lower side of the patterned window have a second curvature, the first curvature and the second curvature being different from each other.

In accordance with an aspect of the disclosure, an electronic device having a flexible display is provided, wherein the flexible display includes a patterned window, the patterned window includes a plurality of patterned portions, and the patterned portions each have at least three corners having a predetermined curvature, wherein a distance between the patterned portions may be configured to decrease from a top end of the patterned portion to a predetermined point, and to increase from the predetermined point to a bottom end thereof corresponding to the predetermined curvature.

In accordance with an aspect of the disclosure, an electronic device including a flexible display module is provided, wherein the flexible display module includes a patterned window, the patterned window includes a plurality of patterned portions, and the plurality of patterned portions each have at least three corners having a predetermined curvature, wherein one or more first corners formed on an upper side of the patterned window are formed using a first beam having a first irradiation angle, and one or more second corners formed on a lower side of the patterned window are formed using a second beam having a second irradiation angle, and the curvatures of the first corner and the second corner being formed to be different from each other.

The first curvature and the second curvature of the electronic device according to an embodiment may be determined based on an irradiation angle of a beam irradiated to form the patterned portion, although the disclosure is not limited thereto.

In accordance with an aspect of the disclosures, an electronic device including a flexible display, wherein the flexible display includes a patterned window, the patterned window comprising a plurality of patterned portions, and the plurality of patterned portions each having at least three corners having a predetermined curvature, wherein a first corner formed on an upper side of the patterned window has a first curvature, and wherein a second corner formed on a lower side of the patterned window has a second curvature, the first curvature and the second curvature being different from each other, wherein in at least a portion of the patterned window, two patterned portions, of the plurality of patterned portions are spaced apart in a first direction, extending in a second direction, wherein at least one of the plurality of patterned portions has at least one of a trapezoidal cross-section, a hexagonal cross-section or a quadrangular cross-section.

According to an embodiment of the disclosure, the impact resistance of the display module provided in the electronic device can improve and further, the pattern adopted to improve the impact resistance may not be viewable when looking at the display module as well.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and configurations may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
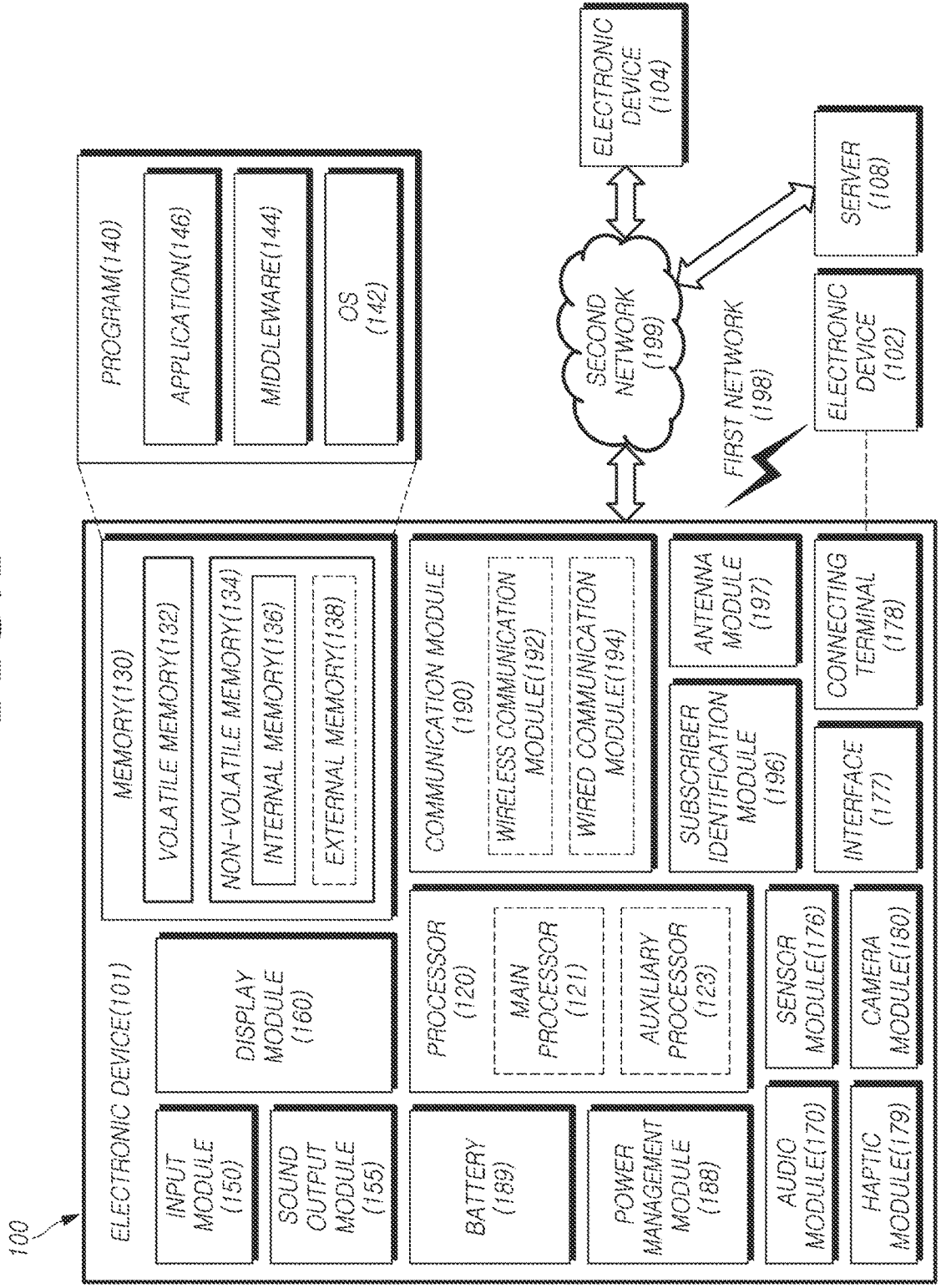
FIG. 1 is a block diagram of an electronic device in a network environment according to an embodiment of the disclosure.

FIG. 1 is a block diagram illustrating an electronic device in a network environment 100 according to an embodiment of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an accelerometer, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, Wi-Fi direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN))). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module 197 may include one antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
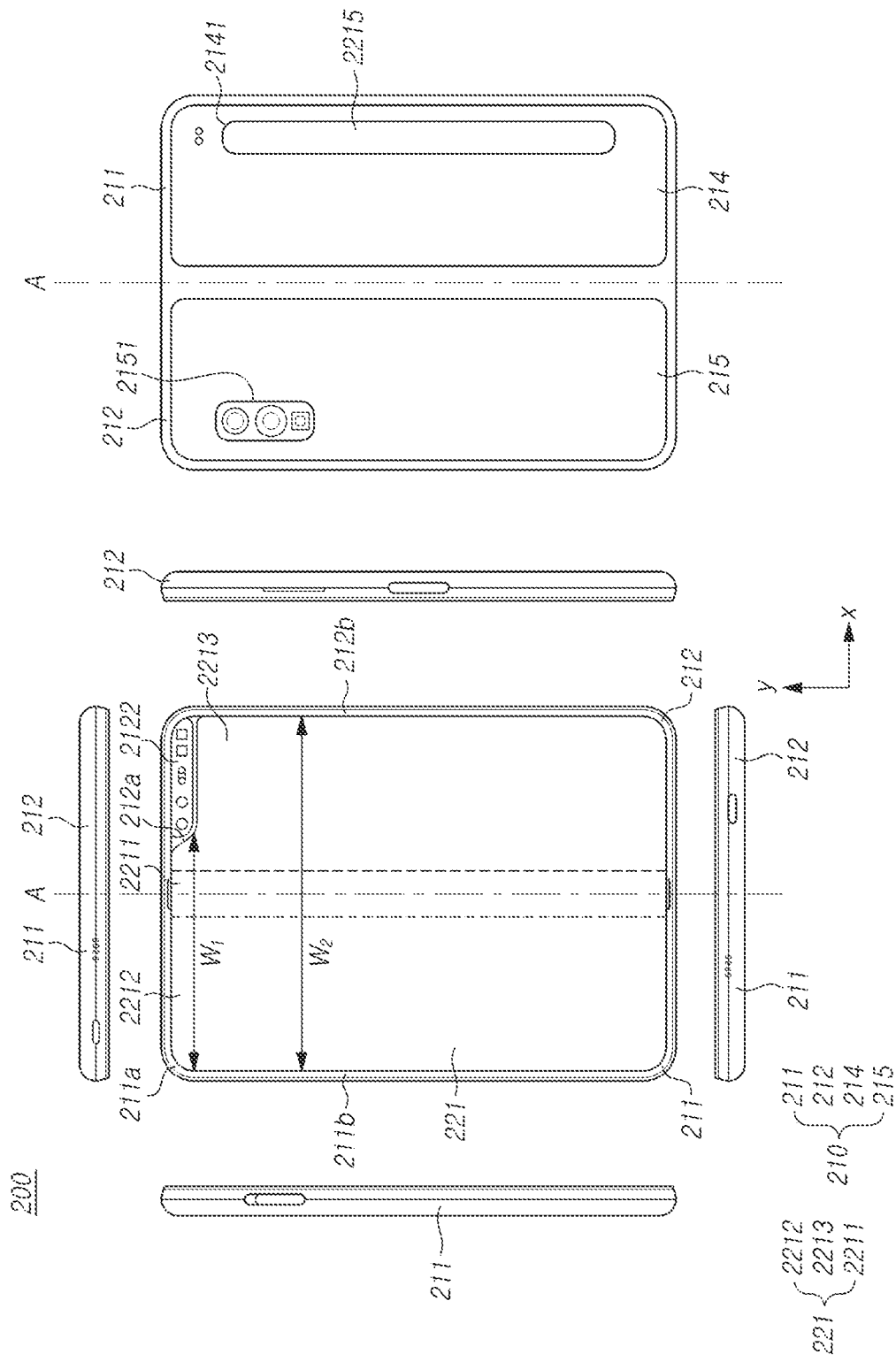
FIG. 2A is a diagram illustrating an unfolded state of an electronic device according to an embodiment of the disclosure.

FIG. 2A is a diagram illustrating an unfolded state of an electronic device according to an embodiment of the disclosure.

Figure 2B:
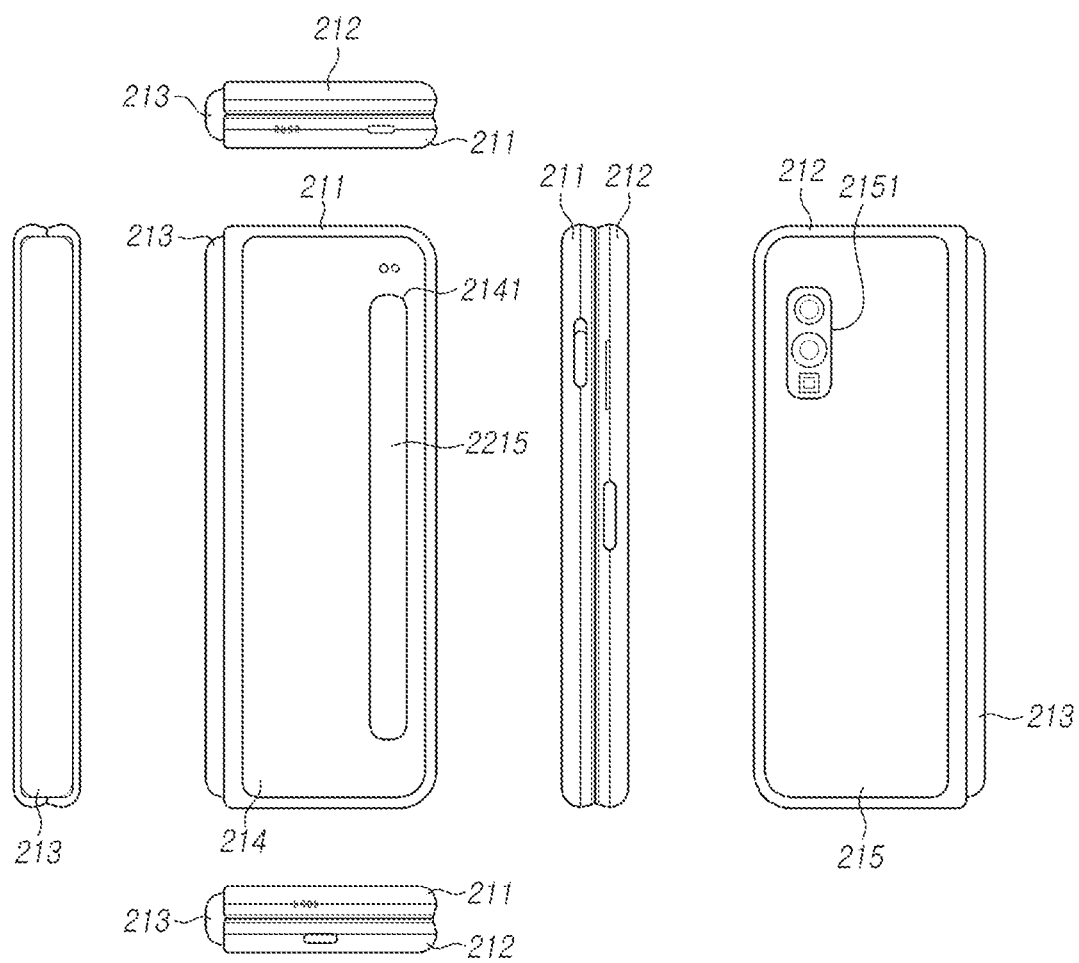
FIG. 2B is a diagram illustrating a folded state of an electronic device according to an embodiment of the disclosure.

FIG. 2B is a diagram illustrating a folded state of the electronic device according to an embodiment of the disclosure.

Referring to FIGS. 2A and 2B, according to an embodiment, the electronic device 200 may include a foldable housing 210, a hinge cover 213 to cover a foldable portion of the foldable housing 210, and a flexible or foldable display 221 disposed in a space formed by the foldable housing 210. Throughout the disclosure, a surface on which the display 221 is disposed is defined as a first surface or a front surface of the electronic device 200. Further, an opposite surface of the front surface is defined as a second surface or a rear surface of the electronic device 200. Further, a surface surrounding a space between the front surface and the rear surface is defined as a third surface or a side surface of the electronic device 200.

According to an embodiment, the foldable housing 210 may include a first housing structure 211, a second housing structure 212 including a sensor area 2122, a first rear cover 214, and a second rear cover 215. The foldable housing 210 of the electronic device 200 is not limited to the shape and the coupling structure illustrated in FIGS. 2A and 2B, and may be implemented by a combination and/or a coupling of other shapes or parts. For example, in another embodiment, the first housing structure 211 and the first rear cover 214 may be integrally formed, and the second housing structure 212 and the second rear cover 215 may be integrally formed.

According to an embodiment, the first housing structure 211 and the second housing structure 212 may be disposed on both sides about a folding axis (e.g., axis A), and may have a substantially symmetrical shape with respect to the folding axis A. As will be described later, an angle or a distance between the first housing structure 211 and the second housing structure 212 may vary depending on whether the electronic device 200 is in an unfolded state, a folded state, or an intermediate state. In an embodiment, unlike the first housing structure 211, the second housing structure 212 may further include the sensor area 2122 in which various sensors are arranged, but they may have a substantially symmetrical shape in other areas. In another embodiment, the sensor area 2122 may be additionally disposed in or replaced with at least a partial area of the first housing structure 211 or the second housing structure 212.

According to an embodiment, the electronic device 200 may be operated in an in-folding manner and/or an out-folding manner by rotation of the first housing structure 211 with respect to the second housing structure 212 in a range of 0 to 360 degrees with a hinge structure (not shown). According to various embodiments, the hinge structure may be formed in a vertical direction or a horizontal direction when the electronic device 200 is viewed from above. According to various embodiments, the electronic device may have a plurality of hinge structures. For example, the plurality of hinge structures may be all arranged in the same direction. As another example, some hinge structures among the plurality of hinge structures may be arranged in a different direction and folded.

According to an embodiment, as shown in FIG. 2A, the first housing structure 211 and the second housing structure 212 may together form a recess for accommodating the display 221. According to an embodiment, due to the sensor area 2122, the recess may have two or more different widths in a direction perpendicular to the folding axis A.

For example, the recess may have a first width w1 between a first portion 211a parallel to the folding axis A of the first housing structure 211 and a first portion 212a formed in an edge of the sensor area 2122 of the second housing structure 212, and a second width w2 between a second portion 211b of the first housing structure 211 and a second portion 212b that is parallel to the folding axis A and does not belong to the sensor area 2122 of the second housing structure 212. In this case, the second width w2 may be formed to be longer than the first width w1. In other words, the first portion 211a of the first housing structure 211 and the first portion 212a of the second housing structure 212 having an asymmetric shape to each other may form the first width w1 of the recess, and the second portion 211b of the first housing structure 211 and the second portion 212b of the second housing structure 212 having a substantially symmetrical shape to each other may form the second width w2 of the recess. According to an embodiment, the first portion 212a and the second portion 212b of the second housing structure 212 may have different distances from the folding axis A. The width of the recess is not limited to the illustrated example. According to various embodiments, the recess can have multiple widths owing to the shape of the sensor area 2122 or the portion having the asymmetric shape of the first housing structure 211 and the second housing structure 212.

According to an embodiment, at least a portion of the first housing structure 211 and the second housing structure 212 may be formed of a metallic material or a non-metallic material having a designated amount of rigidity to support the display 221.

According to an embodiment, the sensor area 2122 may be formed to have a predetermined area adjacent to one corner of the second housing structure 212. However, the arrangement, the shape, and the size of the sensor area 2122 are not limited to the illustrated example. For example, in other embodiments, the sensor area 2122 may be provided at another corner of the second housing structure 212 or any area between the top and bottom corners. According to an embodiment, components for performing various functions embedded in the electronic device 200 may be exposed onto a front surface of the electronic device 200, through the sensor area 2122 or through one or more openings provided in the sensor area 2122. According to various embodiments, the components may include various types of sensors. The sensor may include, for example, at least one of a front camera, a receiver or a proximity sensor, an illuminance sensor, an iris recognition sensor, an ultrasonic sensor, or an indicator.

According to an embodiment, the first rear cover 214 may be disposed on one side of a folding shaft on the rear surface of the electronic device, and may have, for example, a substantially rectangular periphery, the periphery being covered with the first housing structure 211. Similarly, the second rear cover 215 may be disposed on the other side of the folding axis of the rear surface of the electronic device, of which periphery may be covered with the second housing structure 212.

According to an embodiment, the first rear cover 214 and the second rear cover 215 may have a substantially symmetrical shape with respect the folding axis (e.g., axis A). However, the first rear cover 214 and the second rear cover 215 do not necessarily have the symmetrical shape, and in another embodiment, the electronic device 200 may have various shapes of the first rear cover 214 and the second rear cover 215. In another embodiment, the first rear cover 214 may be integrally formed with the first housing structure 211, and the second rear cover 215 may be integrally formed with the second housing structure 212.

According to an embodiment, the first rear cover 214, the second rear cover 215, the first housing structure 211, and the second housing structure 212 may form an internal space in which various components of the electronic device 200 (e.g., a printed circuit board, or a battery) may be arranged. According to an embodiment, one or more components may be disposed or visibly exposed on the rear surface of the electronic device 200. For example, at least a portion of a sub-display 2215 may be visually exposed through a first rear area 2141 of the first rear cover 214. In another embodiment, one or more components or sensors may be visually exposed through a second rear area 2151 of the second rear cover 215. According to various embodiments, the sensor may include a proximity sensor and/or a rear camera.

Referring to FIG. 2B, the hinge cover 213 may be disposed between the first housing structure 211 and the second housing structure 212 to cover internal components (e.g., a hinge structure). According to an embodiment, the hinge cover 213 may be covered with a portion of the first housing structure 211 and the second housing structure 212 or may be exposed to the outside, according to a state of the electronic device 200 (a flat state or a folded state).

For example, as shown in FIG. 2A, when the electronic device 200 is in an unfolded state, the hinge cover 213 may not be exposed to the outside as it is covered with the first housing structure 211 and the second housing structure 212. For example, as shown in FIG. 2B, when the electronic device 200 is in a folded state (e.g., a fully folded state), the hinge cover 213 may be exposed to the outside between the first housing structure 211 and the second housing structure 212. For example, when the first housing structure 211 and the second housing structure 212 are in an intermediate state that they are folded with a certain angle, the hinge cover 213 may be partially exposed to the outside between the first housing structure 211 and the second housing structure 212. However, in this case, the exposed area may be smaller than in the fully folded state. According to an embodiment, the hinge cover 213 may include a curved surface.

The display 221 may be disposed on a space formed by the foldable housing 210. For example, the display 221 may be seated on a recess formed by the foldable housing 210 and may make up most of the front surface of the electronic device 200.

Accordingly, the front surface of the electronic device 200 may include the display 221, a partial area of the first housing structure 211 adjacent to the display 221, and a partial area of the second housing structure 212. Further, the rear surface of the electronic device 200 may include a first rear cover 214, a partial area of the first housing structure 211 adjacent to the first rear cover 214, a second rear cover 215, and a partial area of the second housing structure 212 adjacent to the second rear cover 215.

The display 221 may refer to a display in which at least a portion of its display area may be transformed into a flat surface or a curved surface. According to an embodiment, the display 221 may include a folding area 2211, a first area 2212 disposed on one side with respect to the folding area 2211 (e.g., a left side of the folding area 2211 shown in FIG. 2A), and a second area 2213 disposed on the other side (e.g., a right side of the folding area 2211 shown in FIG. 2A).

The regional division of the display 221 shown in FIG. 2A is only of an example, and the display 221 may be divided into a plurality of areas (e.g., two or four or more areas) according to its structure or function. For example, as shown in FIG. 2A, the area of the display 221 may be divided by the folding area 2211 extending parallel to y-axis or the folding axis (e.g., axis A), or may be divided on the basis of another folding area (e.g., the folding area parallel to x-axis) or another folding axis (e.g., the folding axis parallel to x-axis).

The first area 2212 and the second area 2213 may have a substantially symmetrical shape with respect to the folding area 2211. However, unlike the first area 2212, the second area 2213 may additionally have a notch (e.g., 2214 in FIG. 2C) cut according to the presence of the sensor area 2122, but in other area it may have a substantially symmetrical shape with respect to the first area 2212. In other words, the first area 2212 and the second area 2213 may include a portion having a shape symmetrical to each other and a portion having a shape asymmetric to each other.

Hereinafter, description will be made of the operation of the first housing structure 211 and the second housing structure 212 according to the state of the electronic device 200 (e.g., a flat state and a folded state), and each area of the display 221.

According to an embodiment, when the electronic device 200 is in a flat state (e.g., in FIG. 2A), the first housing structure 211 and the second housing structure 212 may form an angle of substantially 180 degrees and may be arranged to face the same direction. A surface of the first area 2212 and a surface of the second area 2213 of the display 221 may form substantially 180 degrees with each other to face the same direction (e.g., the front direction of the electronic device). The folding area 2211 may form the same plane as the first area 2212 and the second area 2213.

According to an embodiment, when the electronic device 200 is in a folded state (e.g., in FIG. 2B), the first housing structure 211 and the second housing structure 212 may be disposed to face each other. The surface of the first area 2212 and the surface of the second area 2213 of the display 221 may be arranged to face each other, forming a narrow angle (e.g., between 0 to 10 degrees). At least a portion of the folding area 2211 may be formed of a curved surface having a predetermined curvature.

According to an embodiment, when the electronic device 200 is in a folded state (e.g., in FIG. 2B), the first housing structure 211 and the second housing structure 212 may be arranged with at a certain angle. The surface of the first area 2212 and the surface of the second area 2213 of the display 221 may form an angle greater than that of the folded state and smaller than that of the unfolded state. At least a portion of the folding area 2211 may be formed of a curved surface having a predetermined curvature, and the curvature in this case may be smaller than that in a folded state.

Figure 2C:
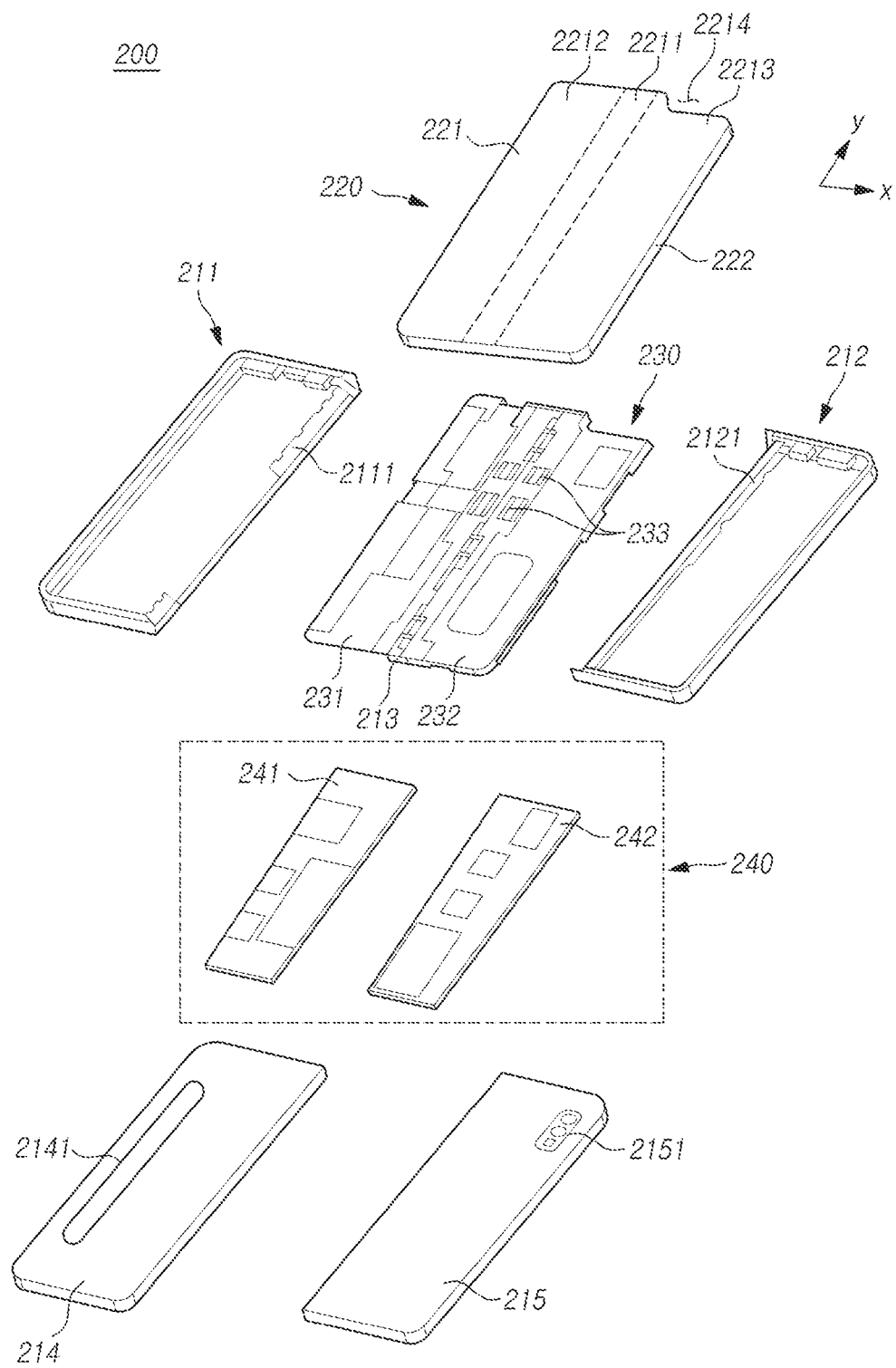
FIG. 2C is an exploded perspective view of an electronic device according to an embodiment of the disclosure.

FIG. 2C is an exploded perspective view of an electronic device according to an embodiment of the disclosure.

Referring to FIG. 2C, according to an embodiment, the electronic device 200 may include a display unit 220, a bracket assembly 230, a substrate 240, a first housing structure 211, a second housing structure 212, a first rear cover 214, and a second rear cover 215. Throughout the disclosure, the display unit 220 may be referred to as a display module or a display assembly.

The display unit 220 may include a display 221 and one or more plates 222 or layers on which the display 221 is seated. According to an embodiment, the plate 222 may be disposed between the display 221 and the bracket assembly 230. The display 221 may be disposed on at least a portion of one surface of the plate 222 (e.g., an upper surface with respect to FIG. 2C). The plate 222 may be formed in a shape corresponding to the display 221. For example, a portion of the plate 222 may be formed in a shape corresponding to the notch 2214 of the display 221.

The bracket assembly 230 may include a first bracket 231, a second bracket 232, a hinge structure (not shown) disposed between the first bracket 231 and the second bracket 232, a hinge cover 213 that covers when the hinge structure is viewed from the outside, and a wiring member 233 (e.g., a flexible printed circuit board (FPCB)) crossing the first bracket 231 and the second bracket 232.

According to an embodiment, between the plate 222 and the substrate 240 may be disposed the bracket assembly 230. For example, the first bracket 231 may be disposed between the first area 2212 of the display 221 and the first substrate 241. The second bracket 232 may be disposed between the second area 2213 of the display 221 and the second substrate 242.

According to an embodiment, at least a portion of the wiring member 233 and the hinge structure may be disposed inside the bracket assembly 230. The wiring member 233 may be disposed in a direction (e.g., x-axis direction) crossing the first bracket 231 and the second bracket 232. The wiring member 233 may be disposed in a direction (e.g., x-axis direction) perpendicular to the folding axis (e.g., y-axis or the folding axis A of FIG. 2A) of the folding area 2211 of the electronic device 200.

As mentioned above, the substrate 240 may include a first substrate 241 disposed on the first bracket 231 side and the second substrate 242 disposed on the second bracket 232 side. The first substrate 241 and the second substrate 242 may be disposed inside a space formed by the bracket assembly 230, the first housing structure 211, the second housing structure 212, the first rear cover 214, and the second rear cover 215. Components for implementing various functions of the electronic device 200 may be mounted on the first substrate 241 and the second substrate 242.

The first housing structure 211 and the second housing structure 212 may be assembled to each other so as to be coupled to both sides of the bracket assembly 230, in a state in which the display unit 220 is coupled to the bracket assembly 230. As will be described later, the first housing structure 211 and the second housing structure 212 may be coupled to the bracket assembly 230, sliding from both sides of the bracket assembly 230.

According to an embodiment, the first housing structure 211 may include a first rotation support surface 2111, and the second housing structure 212 may include a second rotation support surface 2121 corresponding to the first rotation support surface 2111. The first rotation support surface 2111 and the second rotation support surface 2121 may include a curved surface corresponding to the curved surface included in the hinge cover 213.

According to an embodiment, when the electronic device 200 is in an unfolded state (e.g., the electronic device of FIG. 2A), the first rotational support surface 2111 and the second rotational support surface 2121 may cover the hinge cover 213 so that the hinge cover 213 is not exposed to the rear surface of the electronic device 200 or may be minimally exposed. Meanwhile, when the electronic device 200 is in a folded state (e.g., the electronic device of FIG. 2B), the first rotation support surface 2111 and the second rotation support surface 2121 may rotate along a curved surface included in the hinge cover 213 so that the hinge cover 213 may be maximally exposed to the rear surface of the electronic device 200.

Figure 3A:
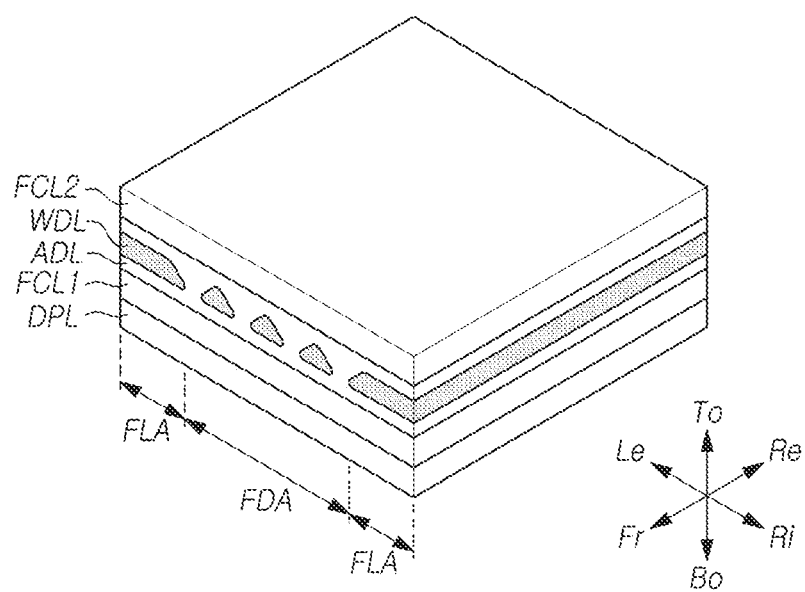
FIGS. 3A and 3B are schematic diagrams of a display module according to various embodiments of the disclosure.
Figure 3B:
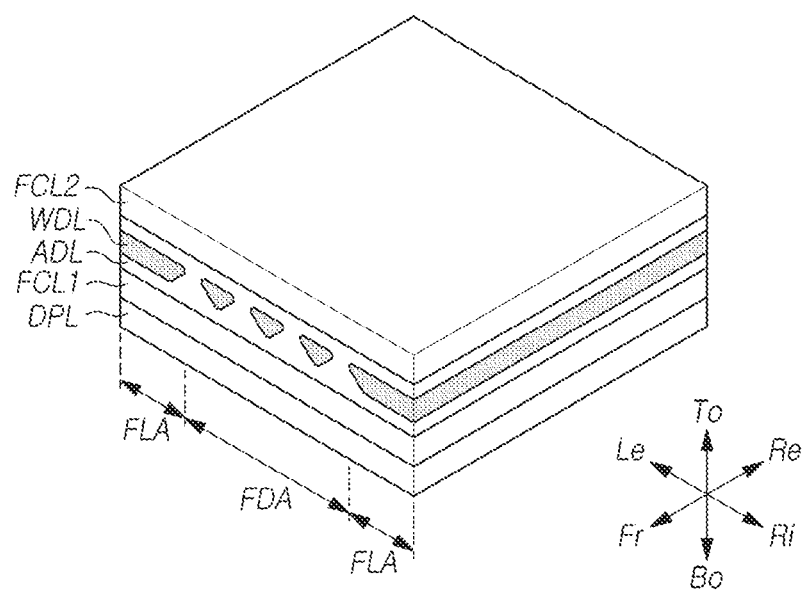

FIGS. 3A and 3B are schematic diagrams of a display module according to various embodiments of the disclosure.

An electronic device according to an embodiment of the document may include one or more display modules. According to an embodiment, the display module may include a display portion DPL, a window portion WDL, and a protection portion FCL2.

According to an embodiment, the display portion DPL may include or be made of one or more display panels. The display panel may include, for example, a light emitting device such as an organic light emitting diode (OLED), a liquid crystal display (LCD), or a quantum nano emitting diode (QNED), but the disclosure is not limited thereto.

According to an embodiment, the window portion WDL may include one or more windows, and the window may include one or more bending layers and an adhesive member ADL. The window portion WDL, which is at least one portion of the display module, has the windows arranged thereon, and the windows may refer to a stacked component disposed in one portion. According to an embodiment, the bending layer may have a thin thickness enough to be flexibly deformed, or may have a pattern for adjusting or cutting a thickness of at least one portion thereof. The adhesive member ADL may be positioned between the bending layer and other components to bond the bending layer and other components (e.g., the display portion DPL and/or the protection portion FCL2). The adhesive member ADL may include or be made of, for example, an optically clear adhesive film (OCA) or an optically clear resin (OCR), but the disclosure is not limited thereto.

Figure 6:
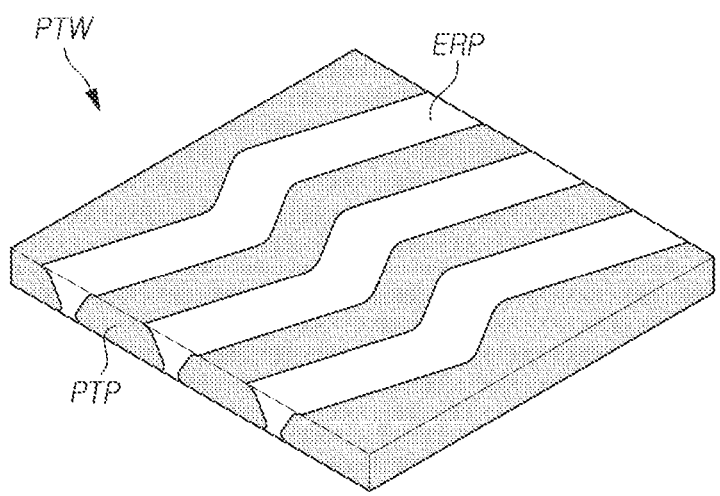

According to an embodiment, the adhesive member ADL may be made of a material having the same optical characteristics as the window portion WDL (e.g., the patterned window PTW of FIG. 6). The adhesive member ADL may be made of, for example, a polymer material having the same or corresponding optical refractive index as the window portion WDL. Since the window portion WDL and the adhesive member ADL have the same or corresponding optical refractive indices, light refraction characteristics may not deteriorate even if a boundary between the window portion WDL and the adhesive member ADL is complicatedly formed.

According to an embodiment, one or more erasing portions (e.g., ERP of FIG. 6) may be formed in the bending layer (e.g., the patterned window PTW of FIG. 6). According to an embodiment, the erasing portion (e.g., ERP of FIG. 6) formed on the bending layer (e.g., the patterned window PTW of FIG. 6) may be formed to extend from an upper side of the window to its lower side. In other words, the erasing portion (e.g., ERP of FIG. 6) may be formed to vertically penetrate the bending layer (e.g., the patterned window PTW of FIG. 6). A plurality of erasing portions (e.g., ERP of FIG. 6) may improve flexibility of the window, and the bending layer (e.g., the patterned window PTW of FIG. 6) in a portion provided with the erasing portions (e.g., ERP of FIG. 6) may be bent, folded, or rolled up. For example, at least one area in which the erasing portions (e.g., ERP of FIG. 6) are provided may be referred to as a foldable area FDA, and at least one area in which the erasing portions (e.g., ERP of FIG. 6) are not provided may be referred to as a flat area FLA. According to an embodiment, the foldable area FDA may be provided in the center of the window, and the flat area FLA may be provided to extend from the left and right sides of the foldable area FDA to its edges. Since the erasing portion (e.g., ERP of FIG. 6) is not formed in the flat area FLA, the display module may not be bent or folded, whereas the display module may be bent or folded as described above in the foldable area FDA.

According to an embodiment, a cross-section of the display module may have different cross-sectional shapes in a front direction and a side direction. When viewed from the front direction, the adhesive member ADL may be configured to surround a portion of the bending layer (e.g., the patterned window PTW of FIG. 6) that is spaced apart from each other being cut-off or etched by the erasing portion (e.g., ERP of FIG. 6). When viewed from the side direction, the adhesive member ADL may be divided above and below by the bending layer (e.g., the patterned window PTW of FIG. 6).

According to an embodiment, the erasing portion (e.g., ERP of FIG. 6) may be provided in the form of a trench or recess leaving at least a portion of the window in a cut-off (or etched) direction. According to another embodiment, the erasing portion (e.g., ERP of FIG. 6) may be provided in the form of a hole penetrating the window in the cut-off (or etched) direction. According to an embodiment, a width of the erasing portion (e.g., ERP of FIG. 6) may be formed to have variability that becomes wider or narrower as it goes from the upper side to the lower side of the window. Referring to FIG. 3A, the erasing portion (e.g., ERP of FIG. 6) is illustrated to be formed so that its width becomes narrower as it goes farther from the upper side to the lower side. Referring to FIG. 3B, the erasing portion (e.g., ERP of FIG. 6) is illustrated to be formed so that its width becomes wider as it goes farther from the upper side to the lower side.

The disclosure is not limited to the example shown in FIGS. 3A and 3B, and the erasing portion (e.g., ERP of FIG. 6) may be designed to have a variable width in the upper and lower directions of the window, as described above.

According to an embodiment, the protection portion FCL2 may be arranged above the window portion WDL. The protection portion FCL2 may be provided to protect one or more components (e.g., the window portion WDL and the display unit DPL) provided at the lower side of the display module, from any impact applied from the upper side thereof. The protective part FCL2 may include or be made of one or more protective layers. The one or more protective layers may include, for example, a hard coating layer, and further include an anti-finger (AF) coating layer. Meanwhile, according to an embodiment, the protection part FCL2 may be formed of a material having a high modulus material, and the hard coating layer may have flexibility to allow bent or folding, for example. Further, as an uppermost layer directly exposed to the outside, the protection part FCL2 may need to have chemical resistance and corrosion resistance. To this end, the protection part FCL2 may include, for example, an acryl-based compound, an epoxy-based compound, an organic-inorganic complex compound, or a combination thereof. However, the disclosure is not necessarily limited thereto, and may include other ultraviolet (UV)-curable resins other than the acryl-based compound and the epoxy-based compound.

According to an embodiment, the display module may further include one or more functional portions FCL1. The functional portion FCL1 may be a thermoplastic resin layer or a thermosetting resin layer that is at least partially introduced into the display module to perform a predetermined role. The functional portion FCL1 may include, for example, an impact absorbing layer. In more detail, the impact absorbing layer may be a polymer layer that is arranged between the display panel and the window portion WDL to reduce the amount of impact applied to the display panel. Further, although not limited thereto, the functional portion FCL1 may be made of a heat dissipation member or a waterproof member.

Figure 4:
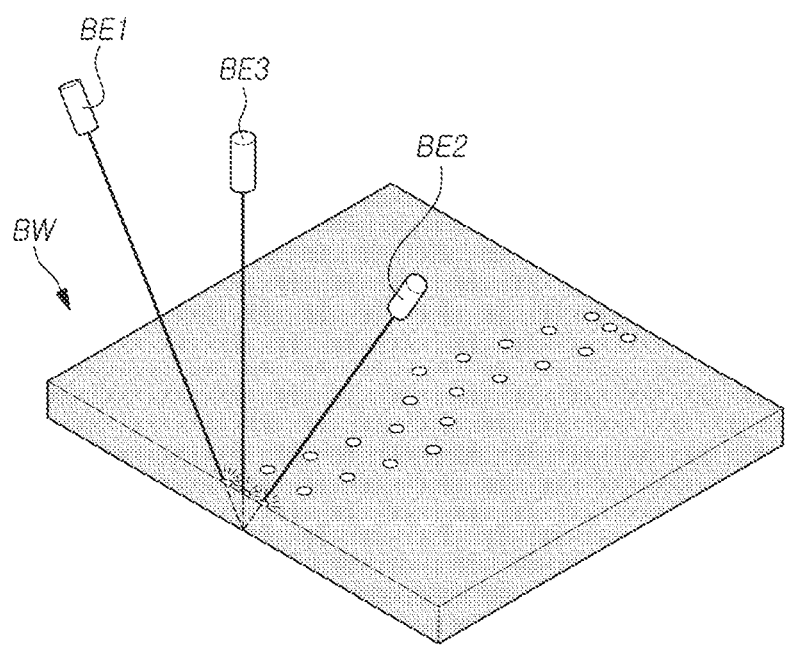
FIGS. 4, 5, and 6 are diagrams illustrating an example of a patterning process of a bending layer according to various embodiments of the disclosure.
Figure 5:
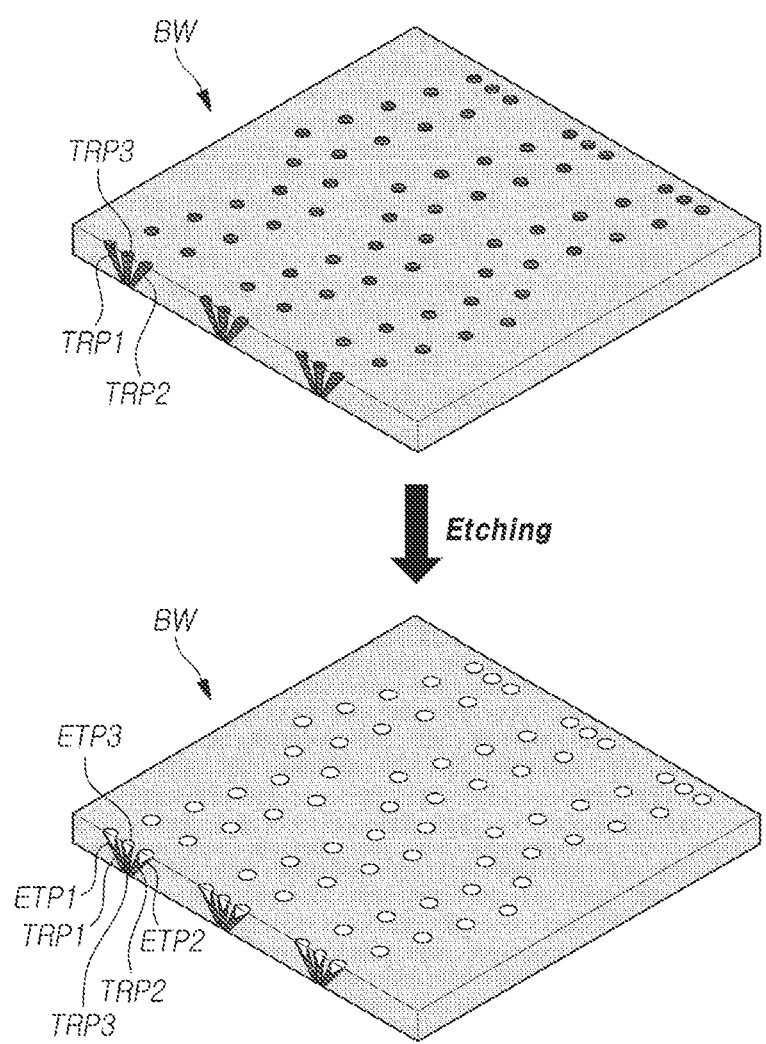

FIGS. 4, 5, and 6 are views illustrating a patterning process of a bending layer according to various embodiments of the disclosure.

According to an embodiment, referring to FIG. 4, a base window BW may be irradiated by one or more beam emitters BE1, BE2 and/or BE3. The one or more beam emitters BE1, BE2, and/or BE3 may include, for example, femtosecond lasers, but the disclosure is not limited thereto.

According to an embodiment, the one or more beam emitters BE1, BE2 and/or BE3 may be configured with a dot beam laser. The dot beam laser may pass through a portion of the base window BW to effectively cause a phase transition for the portion. According to an embodiment, the one or more of the beam emitters BE1, BE2 and/or BE3 may be configured with a line beam laser. Unlike the dot beam laser, the line beam laser may cause a phase transition in line, thereby reducing the number of beam irradiations compared to the dot beam laser. According to an embodiment, referring to FIGS. 4 and 5, the one or more beam emitters BE1, BE2 and/or BE3 may irradiate a dot beam at a preset angle. According to an embodiment, at least some BE1 and/or BE2 of the beam emitters can irradiate the dot beam at an inclined angle. According to an embodiment, at least one beam emitter BE3 of the beam emitters may irradiate the dot beam perpendicular to the base window BW. According to an embodiment, a plurality of dot patterns may be formed on the base window BW by the beam emitters BE1, BE2, and/or BE3. In the disclosure, a beam emitter that irradiates a beam in a state inclined at a predetermined inclination with respect to the base window BW may be referred to as an "inclined beam emitter." Throughout the disclosure, a beam emitter that irradiates a dot beam perpendicular to the base window BW may be referred to as a "vertical beam emitter." According to various embodiments of the disclosure, description of a process of forming a modified region by the vertical beam emitter may be omitted.

According to an embodiment, a phase transition may occur in a region corresponding to a plurality of dot patterns to form various modified regions TRP1, TRP2, and TRP3 in one region of the base window BW. According to an embodiment of the disclosure, the modified regions TRP1, TRP2, and TRP3 may be regions to be cut.

FIG. 4 illustrates an example case in which the modified regions TRP1, TRP2, and TRP3 are intermittently formed, but the disclosure is not limited thereto, and the modified regions TRP1, TRP2, and TRP3 may be continuously formed.

According to an embodiment, the one or more beam emitters BE1, BE2 and BE3 may irradiate a dot beam at a certain angle. Accordingly, the modified regions TRP1, TRP2, and TRP3 may be formed in the base window BW along an irradiation direction of the beam pattern.

According to an embodiment, the one or more inclined beam emitters BE1 and BE2 may irradiate a dot beam in a first direction and a second direction. In an embodiment, the inclined beam emitters BE1 and BE2 may be symmetrical or asymmetrical with respect to each other in the first direction and the second direction, respectively. The inclined beam emitters BE1 and BE2 in the symmetrical first and second directions may irradiate the beam, being inclined at the same angle with respect to the normal of the base window BW. The inclined beam emitters BE1 and BE2 in the asymmetric first and second directions may irradiate the beam, being inclined at different angles with respect to the normal of the base window BW. However, even in the asymmetric first and second directions, the inclined beam emitters BE1 and BE2 may irradiate the beam toward a common irradiation point located inside or below the base window BW. Further, the beam emitters BE1 and BE2 may be respectively located on the left and right sides with respect to the common irradiation point.

Referring then to FIG. 5, according to an embodiment, one or more vertical beam emitters BE3 may irradiate a dot beam in a direction perpendicular to the base window. According to an embodiment, the vertical beam emitter E3 may be controlled or configured to irradiate the dot beam between the points targeted by the inclined beam emitters BE1 and BE2. According to an embodiment, the modified regions TRP1, TRP2 and TRP3 may include or be divided into inclined modified regions TRP1 and TRP2 formed by the inclined beam emitters BE1 and BE2 irradiating the dot beam with a predetermined inclination, and a vertical modified region TRP3 formed by the vertical beam emitters BE3. According to an embodiment, the vertical modified region TRP3 may be formed between the inclined modified regions TRP1 and TRP2. A portion of the base window BW may be separated into fragments by the vertical modified region TRP3 formed between the inclined modified regions TRP1 and TRP2, but the disclosure is not limited thereto. Although not limited thereto, in an embodiment, a part of the base window BW may be separated into fragments by forming additional inclined modified regions TRP1 and TRP2 on the base window BW in place of the vertical modified region TRP3.

According to an embodiment, as an etchant is introduced into the modified regions TRP1, TRP2, and TRP3, etching of the base window BW may be performed. Since the modified regions TRP1, TRP2, and TRP3 have a high etching rate unlike other regions, they may be removed prior to other portions of the base window BW. Referring to FIG. 5, the modified regions TRP1, TRP2, and TRP3 may be etched prior to other portions of the base window BW. The etching regions ETP1, ETP2, and ETP3 may extend below the base window so as to include at least a portion of the modified regions TRP, TRP2, and TRP3. According to an embodiment, the etching regions ETP1, ETP2, and ETP3 may eventually extend downward until penetrating the lower side of the base window, but the disclosure is not limited thereto. According to another embodiment, it may extend only up to one point before penetrating the base window BW.

According to an embodiment, as the etching is performed, the base window BW may be etched below the base window BW along with the modified regions TRP1, TRP2, and TRP3 in a portion corresponding to the modified regions TRP1, TRP2, TRP3 and. At this time, as the modified regions TRP1, TRP2, and TRP3 are etched at a faster rate than other portions, a circular or elliptical pattern may be formed in the base window BW when viewed from the top, as shown in FIG. 5. The circular or elliptical pattern formed by the etching may be formed wider than the dot pattern of the modified regions TRP1, TRP2, and TRP3 shown in FIG. 5.

According to an embodiment, referring to FIGS. 5 and 6, as the etching is continuously performed, at least a portion of the base window BW may be removed to form a predetermined pattern. As portions corresponding to the modified regions TRP1, TRP2, and TRP3 are removed through etching, at least the portion of the base window BW may be separated and lost. In other words, as at least the portion of the base window BW is separated or lost, the etching regions ETP1, ETP2, and ETP3 may be formed.

As shown in FIGS. 4 to 7, the modified regions TRP1, TRP2, and TRP3 may be formed based on a pattern shape of the patterned window PTW to be finally formed by etching. For example, when a plurality of dot patterns are connected by a line, a straight line, a curved line, or a zigzag line may be formed. As a result of etching the modified regions TRP1, TRP2, and TRP3, adjacent ones of the plurality of dot patterns are directly connected, and therefore, at least a portion of the base window BW may be removed to form a patterned portion PTP.

Referring again to FIG. 6, as a result of etching the base window BW, the patterned window PTW may include one or more patterned portions PTP and one or more erasing portions ERP. As such, a window including the one or more patterned portions PTP and erasing portions ERP may be referred to as a patterned window. In at least a portion of the patterned window, two or more patterned windows may be formed to be spaced apart from each other by the erasing portions ERP. In at least a partial region of the patterned window, two or more patterned windows may be formed to be continuously connected to each other. According to an embodiment, the patterned portions PTP and the erasing portions ERP may be formed, as a part of the base window BW corresponding to the erasing portion ERP is removed from the base window BW.

According to an embodiment, two or more erasing portions ERP may be separated by the patterned portion PTP in at least one region of the erasing portion ERP. The patterned portion PTP that divides the erasing portions ERP may be formed by the vertical beam emitter BE3 as shown in FIGS. 4 and 5. According to an embodiment, the vertical modified region TRP3 may be formed in the base window BW by the vertical beam emitter BE3. The vertical modified region TRP3 may define a region to be erased as fragments from the base window BW. For example, a portion surrounded by the plurality of inclined modified regions TRP1 and TRP2 and the two vertical modified regions TRP3 may be separated into fragments from the base window BW. According to an embodiment, the erasing portion ERP may be formed in the base window BW in various shapes according to a position in which the vertical modified region TRP3 is formed.

Figure 7:
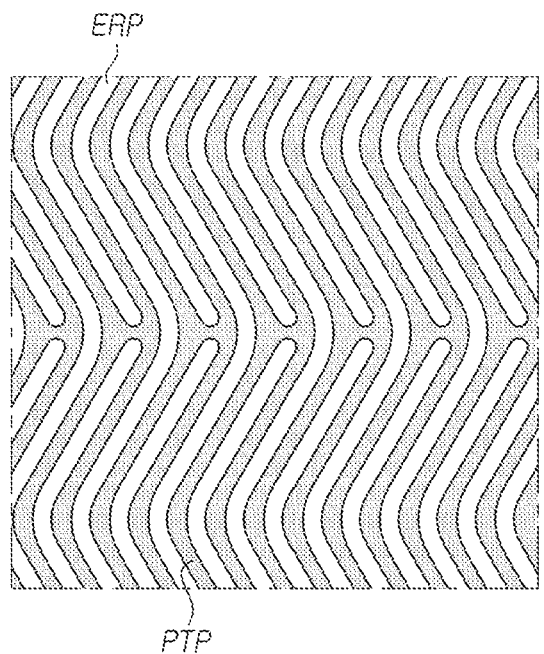
FIG. 7 is a view illustrating a top view of a patterned window according to an embodiment of the disclosure.

FIG. 7 is a view illustrating a top view of a patterned window according to an embodiment of the disclosure.

According to an embodiment, referring to FIG. 7, the patterns of the patterned portion PTP and the erasing portion ERP may be formed in a zigzag shape when viewed from above, but the disclosure is not limited thereto, and they may be formed in various shapes such as e.g., a straight line or a curve.

Figure 8A:
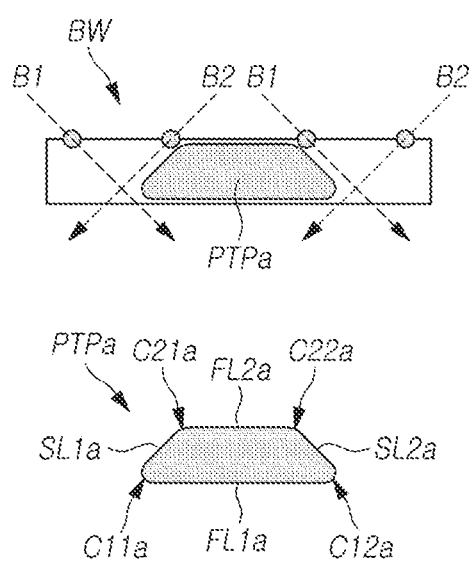
FIGS. 8A, 8B, 9A, 9B, and 9C are views illustrating a shape of a side cross-section of a patterned portion according to various embodiments of the disclosure.
Figure 8B:
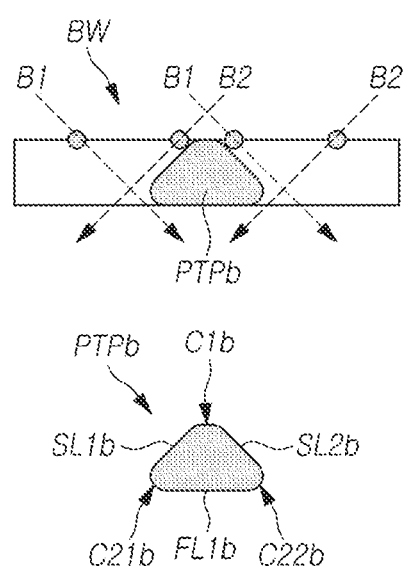

FIGS. 8A and 8B are schematic diagrams illustrating a cross-sectional shape of a patterned portion according to various embodiments of the disclosure.

Referring to FIG. 8A, the patterned portion may be formed to have a trapezoidal cross-section having at least four corners. Referring to FIG. 8B, the patterned portion may be formed to have a triangular cross-section having at least three corners.

Referring to FIG. 8A, in the patterned portion PTPa according to an embodiment, an upper side surface FL2$a$ and a lower side surface FL1$a$ of the trapezoidal cross-section may be formed to be parallel to each other. According to an embodiment, a left inclined surface SL1$a$ and a right inclined surface SL2$a$ of the trapezoid may be formed to have different inclinations. According to an embodiment, the inclination of each of the inclined surfaces SL1$a$ and SL2$a$ of the trapezoid may be associated with or correspond to a beam irradiation angle of the beam emitter irradiated to the base window BW. For example, the right inclined surface SL2$a$ of the trapezoid may be associated with a first irradiation angle of a first beam B1, and the left inclined surface SL1$a$ of the trapezoid may be associated with a second irradiation angle of a second beam B2. As the first beam B1 and the second beam B2 are irradiated, a modified region may be formed in the base window BW in a downward direction of the base window BW, and etching of the portion corresponding to the modified region is performed faster than the other portions. Thus, the irradiation angle of the beam and the inclination of the inclined surface may be formed in association with each other.

According to an embodiment, an upper-left corner C21$a$ and an upper-right corner C22$a$ of the trapezoidal cross-section may have the same or different curvatures. According to an embodiment, the curvature of each corner may be associated with or correspond to the beam irradiation angle of the beam emitter irradiated to the base window BW. For example, the curvature of the upper-right corner C22$a$ and the lower-right corner C12$a$ of the trapezoid may be associated with the first irradiation angle of the first beam B1. For example, the curvature of the upper-left corner C21$a$ and the lower-left corner C11$a$ of the trapezoid may be associated with the second irradiation angle of the second beam B2. This is because, as in the inclined surface, as the first beam B1 and the second beam B2 are irradiated, the modified region is formed in the base window BW in a downward direction of the base window BW, and etching of a portion corresponding to the modified region is performed at a faster rate than other portions.

Referring to FIG. 8B, in the patterned portion PTPb according to an embodiment, the left inclined surface SL1b and the right inclined surface SL2b of the triangle may be formed to have different inclinations. According to an embodiment, the inclination of each of the inclined surfaces SL1b and SL2b of the triangle may be associated with or correspond to the beam irradiation angle of the irradiated beam emitter irradiated to the base window BW. For example, the right inclined surface SL2b of the triangle may be associated with the first irradiation angle of the first beam B1, and the left inclined surface SL1b of the triangle may be associated with the second irradiation angle of the second beam B2. As the first beam B1 and the second beam B2 are irradiated, a modified region may be formed in the base window BW in a downward direction of the base window BW, and etching of the portion corresponding to the modified region is performed at a faster rate than the other portions. Therefore, irradiation angle of the beam and the inclination of the inclined surface may be formed in association with each other.

According to an embodiment, the lower-left corner C21b and the lower-right corner C22b of the triangular cross-section may have the same or different curvatures. According to an embodiment, the curvature of each of the corners C21b and C22b may be associated with or correspond to the beam irradiation angle of the beam emitter irradiated to the base window BW. For example, the curvatures of the upper-right corner C1b and the lower-right corner C22b of the triangle may be associated with the first irradiation angle of the first beam B1. For example, the curvatures of the triangle upper corner C1b and the lower-left corner C21b may be associated with the second irradiation angle of the second beam B2. This is because, as in the case of the inclined surface, as the first beam B1 and the second beam B2 are irradiated, a modified region is formed in the base window BW in a downward direction of the base window BW, and etching of the portion corresponding to the modified region is performed at a faster rate than other parts.

According to an embodiment, the left inclined surfaces SL1a and SL1b and the right inclined surfaces SL2a and SL2b in the patterned portions PTPa and PTPb may be connected to one or more corners (e.g., C21a, C22a or C1b) formed on the upper side of the patterned portions PTPa and PTPb. Further, the left inclined surfaces SL1a and SL1b and the right inclined surfaces SL2a and SL2b may be formed symmetrically or asymmetrically. Such symmetry or asymmetry may be determined based on an irradiation angle of a beam irradiated to the base window BW.

According to an embodiment, as the curvature of the corners C21a, C22a, and C1b formed in the upper side increases, the curvature of the corners C11a, C12a, C21b, and C22b formed in the lower side may decrease. According to an embodiment, as the curvature of the upper corners C21a, C22a, and C1b decreases, the curvature of the lower corners C11a, C12a, C21b, and C22b may increase.

According to an embodiment, one or more corners may have an R value (curvature) in a range of 0.05 R to 0.02 R, preferably in a range of 0.02 R or more, or preferably in a range of 0.05 R or more. According to an embodiment, the R value may be adjusted differently by the refractive index of the base window and the OCR.

Figure 9A:
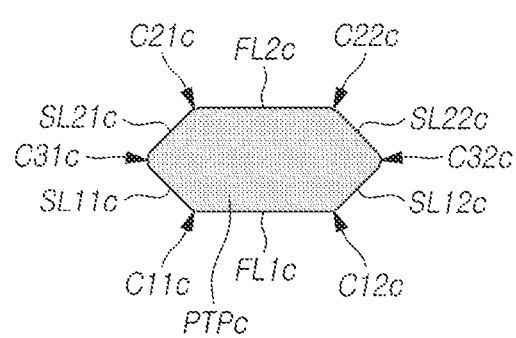
Figure 9B:
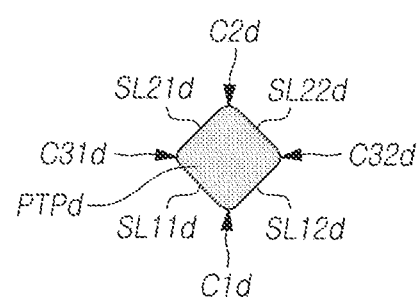
Figure 9C:
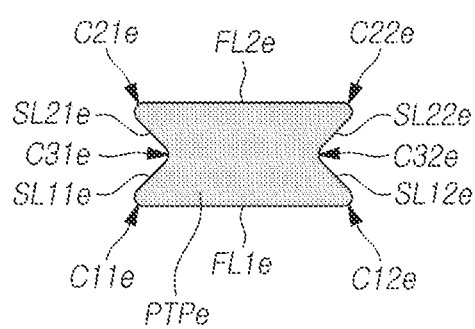

FIGS. 9A, 9B, and 9C illustrate cross-sections of patterned portions according to various embodiments of the disclosure. The cross-section of the patterned portion shown in FIGS. 9A, 9B, and 9C may be formed by irradiating a beam to both surfaces of the base window.

Referring to FIG. 9A, the patterned portion PTPc may be formed to have a hexagonal cross-section with at least six corners. Referring to FIG. 9B, the patterned portion PTPd may be formed to have a cross-section of a quadrangle (e.g., a parallelogram) with at least four corners.

Referring to FIG. 9A, in the patterned portion PTPc according to an embodiment, the upper side surface FL2c and the lower side surface FL1c of the hexagonal cross-section may be formed to be parallel to each other.

According to an embodiment, at least two inclined surfaces adjacent to each other may be formed to have different inclinations. For example, the lower-left inclined surface SL11c and the upper-left inclined surface SL21c of the hexagonal cross-section may be formed to have different inclinations. For example, the lower-right inclined surface SL12c and the upper-right inclined surface SL22c of the hexagonal cross-section may be formed to have different inclinations.

According to an embodiment, at least two inclined surfaces between which the upper surface FL2c or the lower surface FL1c are disposed may be formed to have different inclinations. For example, the upper-left inclined surface SL21c and the upper-right inclined surface SL22c may be formed to have different inclinations. For example, the lower-left inclined surface SL11c and the lower-right inclined surface SL12c may be formed to have different inclinations.

According to an embodiment, two inclined surfaces adjacent to each other of the hexagonal cross-section may be formed to have the same or different inclination with respect to each other. For example, the lower-left inclined surface SL11c and the upper-right inclined surface SL22c of the hexagonal cross-section may be formed to have the same inclination. For example, the upper-left inclined surface SL21c and the lower-right inclined surface SL12c of the hexagonal cross-section may be formed to have the same inclination.

According to an embodiment, the inclination of each inclined surface SL11c, SL12c, SL21c or SL22c of the hexagonal cross-section may be associated with or correspond to the beam irradiation angle of the beam emitter irradiated to the base window BW.

According to an embodiment, the upper-left corner C21c, the lower-left corner C11c, the upper-right corner C22c, and the lower-right corner C12c of the hexagonal cross-section may have the same or different curvatures. According to an embodiment, the left corner C31c and the right corner C32c may have the same curvature. According to an embodiment, the curvature of each corner may be associated with or correspond to the beam irradiation angle of the beam emitter irradiated to the base window BW.

Referring to FIG. 9B, in the patterned portion PTPd according to an embodiment, at least two inclined surfaces adjacent to each other may be formed to have different inclinations. For example, the lower-left inclined surface SL11d and the upper-left inclined surface SL21d of a quadrangular (e.g., parallelogram) cross-section may be formed to have different inclinations. For example, the lower-right inclined surface SL12d and the upper-right inclined surface SL22d of the rectangular cross-section may be formed to have different inclinations.

According to an embodiment, opposite inclined surfaces of the rectangular cross-section may be formed to have the same or different inclinations. For example, the lower-left inclined surface SL11d and the upper-right inclined surface SL22d of the rectangular cross-section may be formed to have the same inclination. For example, the upper-left inclined surface SL21*d* and the lower-right inclined surface SL12*d* of the rectangular cross-section may be formed to have the same inclination. As such, the inclined surfaces facing each other may be formed in parallel.

According to an embodiment, the inclination of each inclined surface SL11*d*, SL12*d*, SL21*d*, or SL22*d* of the rectangular cross-section may be associated with or correspond to the beam irradiation angle of the beam emitter irradiated to the base window BW.

According to an embodiment, the upper corner C2*d* and the lower corner C1*d* of the rectangular cross-section may have the same or different curvatures. According to an embodiment, the left corner C31*d* and the right corner C32*d* may have the same or different curvatures.

Referring to FIG. 9C, in an embodiment, a patterned portion PTPe may be formed to have an hourglass-shaped cross-section having at least six corners.

Referring to FIG. 9C, in the patterned portion PTPe according to an embodiment, an upper surface FL2*e* and a lower surface FL1*e* of the hourglass-shaped cross-section may be formed to be parallel to each other.

According to an embodiment, at least two inclined surfaces adjacent to each other may be formed to have different inclinations. For example, the lower-left inclined surface SL11*e* and the upper-left inclined surface SL21*e* of the hourglass-shaped cross-section may be formed to have different inclinations. For example, the lower-right inclined surface SL12*e* and the upper-right inclined surface SL22*e* of the hourglass-shaped cross-section may be formed to have different inclinations.

According to an embodiment, at least two inclined surfaces between which the upper surface FL2*e* or the lower surface FL1*e* are disposed may be formed to have different inclinations. For example, the upper-left inclined surface SL21*e* and the upper-right inclined surface SL22*e* may be formed to have different inclinations. For example, the lower-left inclined surface SL11*e* and the lower-right inclined surface SL12*e* may be formed to have different inclinations.

According to an embodiment, two inclined surfaces not adjacent to each other of the hourglass-shaped cross-section may be formed to have the same or different inclinations. For example, the lower-left inclined surface SL11*e* and the upper-right inclined surface SL22*e* of the hourglass-shaped cross-section may be formed to have the same inclination. For example, the upper-left inclined surface SL21*e* and the lower-right inclined surface SL12*e* of the hourglass-shaped cross-section may be formed to have the same inclination.

According to an embodiment, the inclination of each inclined surface SL11*c*, SL12*c*, SL21*c* or SL22*e* of the hourglass-shaped cross-section may be associated with or correspond to the beam irradiation angle of the beam emitter irradiated to the base window BW.

According to an embodiment, the upper-left corner C21*e*, the lower-left corner C11*e*, the upper-right corner C22*e*, and the lower-right corner C12*e* of the hourglass-shaped cross-section may have the same or different curvatures. According to an embodiment, the left corner C31*e* and the right corner C32*e* may have the same curvature. According to an embodiment, the curvature of each corner may be associated with or correspond to the beam irradiation angle of the beam emitter irradiated to the base window BW.

Figure 10:
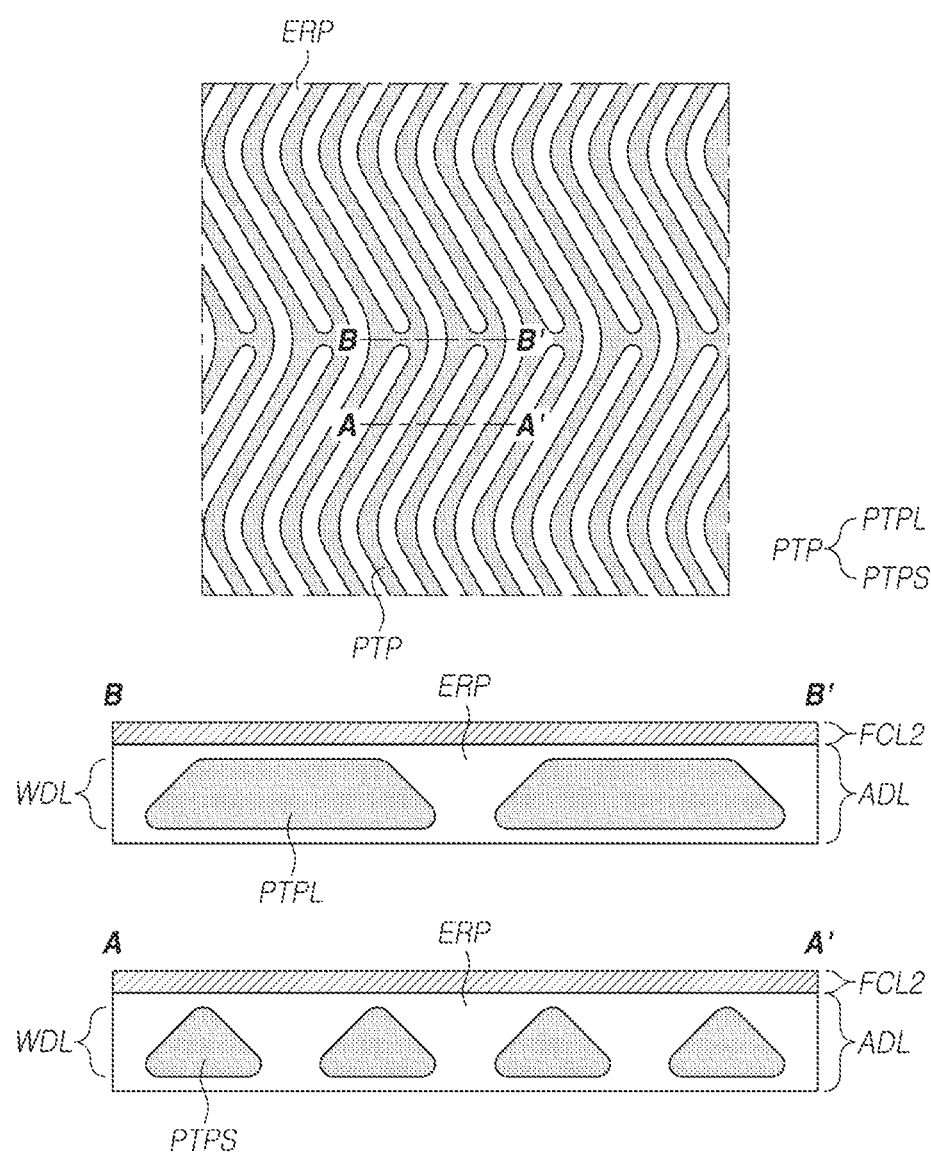
FIG. 10 is a view illustrating a front surface and a side cross-section of a patterned window according to an embodiment of the disclosure.

FIG. 10 is a schematic diagram illustrating cross-sections of a patterned window according to an embodiment of the disclosure.

According to an embodiment, when the patterned window (e.g., PTW of FIG. 6) is viewed from above, at least a portion of the patterned window (e.g., PTW of FIG. 6) may be formed of at least one of a straight line, a curved line, or a zigzag line. Referring to FIG. 10, at least a portion of the patterned window (e.g., PTW of FIG. 6) may be removed by etching, and the erasing portion (ERP) removed by the etching may be made of one repetitive shape or a combination of two or more repetitive shapes. Here, the repeated shape may include a linear shape, a curved shape, a zigzag shape, and a clamp shape, as described above.

As shown in FIG. 10, in the patterned window (e.g., PTW of FIG. 6), the erasing portion ERP may be formed of a combination of a plurality of zigzag shapes and a plurality of clamp shapes, wherein each shape may be formed alternately on the basis of a transverse direction.

Looking at the cross-section of the patterned window (e.g., PTW of FIG. 6), a plurality of patterned portions PTP may be surrounded by an adhesive member ADL to be bonded to an upper protective layer. Referring back to FIGS. 3A and 3B, the plurality of patterned portions PTP may be surrounded by an adhesive member ADL to be bonded to a lower impact preventing portion. According to an embodiment, when any anti-impact portion (e.g., FCL1 of FIGS. 3A and 3B) does not exist, the plurality of patterned portions PTP may be bonded to a lower display portion (e.g., DPL of FIGS. 3A and 3B) by the adhesive member ADL.

According to an embodiment, when two or more shapes are used, the cross-section of the patterned window (e.g., PTW of FIG. 6) may be expressed differently depending on its position. For example, the patterned window (e.g., PTW in FIG. 6) may have two or more cross-sections. A first cross-section taken along a line A-A' may include a first patterned portion PTPL, and a second cross-section taken along a line B-B' may include a second patterned portion PTPS. A width of the patterned portion PTP of the first cross-section may be greater than a sum of widths of the patterned portions PTP of the second cross-section. That is, the patterned portion PTP of the first cross-section may have a greater width than an added sum of the widths of the two second patterned portions PTPS. According to an embodiment, the width of the first patterned portion PTPL may be formed to be the same as or correspond to the sum of the widths of the two second patterned portions PTPS and a distance between the second patterned portions PTPS. According to an embodiment, when etching is performed after irradiating a beam onto the first patterned portion PTPL, two second patterned portions PTPS may be formed.

Figure 11:
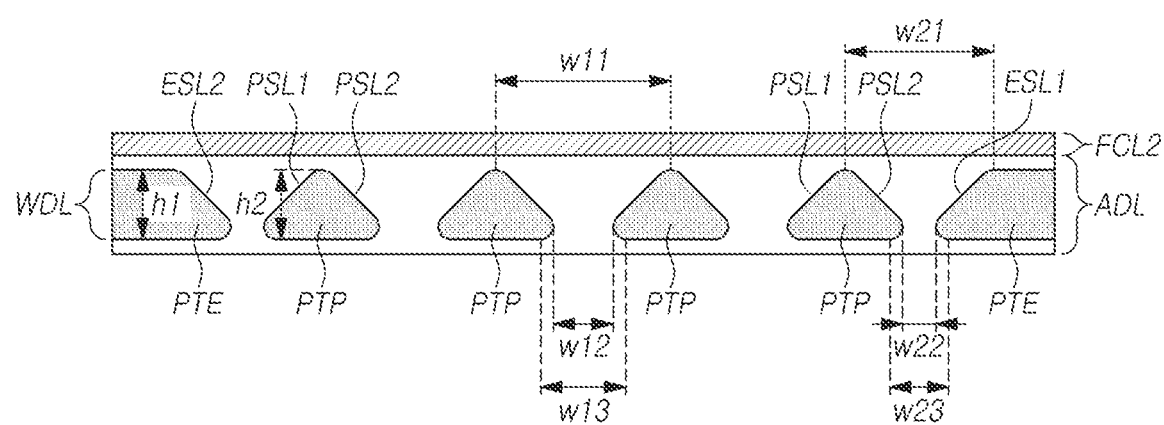
FIG. 11 is a view illustrating a dimensional relationship of a side cross-section of a patterned window according to an embodiment of the disclosure.

FIG. 11 illustrates an example of an overall cross-sectional structure of a patterned window according to an embodiment of the disclosure. In the case of FIG. 11, description is made of the patterned window using the cross-section of the triangle illustrated in FIG. 8B, but the disclosure is not limited thereto. Further, the cross-section of the triangle may be replaced with the cross-sections of the shapes shown in FIGS. 8A and 9A to 9C.

Referring to FIG. 11, one or more center patterned portions (PTP) may be provided in the center of the patterned window (PTW of FIG. 6), and edge patterned portions (PTE) may be provided at leftmost and/or rightmost edges. The center patterned portion PTP may have at least two inclined surfaces PSL1 and PSL2, and the edge patterned portion PTE may have one inclined surface ESL1 or ESL2. That is to say, the edge patterned portions PTE may include a smaller number of inclined surfaces than the center patterned portion PTP.

According to an embodiment, the center patterned portion PTP may include a left inclined surface PSL1 and a right inclined surface PSL2. The inclinations of the left inclined surface PSL1 and the right inclined surface PSL2 have been described above with reference to FIGS. 8A and 8B, and redundant description thereof will be omitted.

According to an embodiment, one inclined surface PSL1 or PSL2 of the center patterned portion PTP may be formed to face an inclined surface ESL2 or ELS1 of the edge patterned portion PTE, and the other inclined surface PSL2 or PSL1 thereof may be formed to go away from the inclined surface ESL2 or ELS1 of the edge patterned portion PTE. The inclined surface of the center patterned portion PTP, which is formed to go away from the inclined surface ELS1 or ESL2 of the edge patterned portion PTE, may have an inclination that is equal to or associated with the inclined surface of the edge patterned portion PTE. According to an embodiment, the inclined surface that goes away from the edge patterned portion PTE of the center patterned portion PTP adjacent to the edge patterned portion PTE, may be formed by a beam having the same irradiation angle as the beam used to form the inclined surface of the edge patterned portion PTE.

For example, the left edge patterned portion PTE and the center patterned portion PTP adjacent to the edge patterned portion PTE, as shown in FIG. 11, will be described. The edge patterned portion PTE may include one inclined surface ESL2. The center patterned portion PTP may include a left inclined surface PSL1 and a right inclined surface PSL2. Here, the left inclined surface PSL1 may have a different inclination from the inclined surface ESL2 of the edge patterned portion PTE, and the right inclined surface PSL2 may have the same or related inclination as the inclined surface ESL2 of the edge patterned portion PTE. The left inclined surface PSL1 of the center patterned portion PTP may be formed based on the beam irradiation of a first irradiation angle, while the right inclined surface PSL2 of the center patterned portion PTP and the inclined surface ESL2 of the edge patterned portion PTE may be formed based on beam irradiation of a second irradiation angle. In such a case, the first and second irradiation angles may be set to be different.

According to an embodiment, the design may be made such that a distance (e.g., a first distance) between the two center patterned portions PTP and a distance (second distance) between the center patterned portion PTP and the edge patterned portion PTE are the same as each other or different from each other.

According to an embodiment, a width of the center patterned portion PTP may be wider or narrower as it goes from the uppermost side to the lowermost side. The width of the center patterned portion PTP may increase up to a certain point, and may decrease from one point to a bottom point of the center patterned portion PTP. The width of the center patterned portion PTP may increase as it goes downward along an inclination of the inclined surface up to a certain point. From the one point to the bottom point of the center patterned portion PTP, the width of the center patterned portion PTP may decrease according to a curvature of a corner in a lower part of the center patterned portion PTP.

According to an embodiment, the distance between the center patterned portions PTP may be narrower or wider as it goes from the upper side to the lower side according to a change in width of the central patterned portion PTP. The distance between the center patterned portions PTP may decrease up to one point, and may increase from the one point to the bottom point of the central patterned portion PTP. The distance between the center patterned portions PTPs may decrease up to one point as it goes farther downward along the inclination of the inclined surface. From the one point to the bottom point of the center patterned portion PTP, the distance between the center patterned portions PTP may increase according to the curvature of the corner in the lower part of the center patterned portion PTP. Here, referring to FIG. 11, the distance between the two center patterned portions PTP on the basis of the upper corners of the central patterned portions PTP may be defined as 'w11', the distance at the one point as 'w12', and the distance at the bottom point as 'w13'.

According to an embodiment, the distance between the central patterned portion PTP and the edge patterned portion PTE may be narrower as it goes from the upper side to the lower side, according to the change in width of the center patterned portion PTP and the edge patterned portion PTE. The distance between the central patterned portion PTP and the edge patterned portion PTE may decrease up to the one point, while it may increase from the one point to the bottom point of the central patterned portion PTP and the edge patterned portion PTE. The distance between the center patterned portion PTP and the edge patterned portion PTE may decrease up to the one point, as it goes farther downward along the inclination of the inclined surface. From the one point to the bottom point of the central patterned portion PTP and the edge patterned portion PTE, the distance between the central patterned portion PTP and the edge patterned portion PTE may increase according to the curvature of the corner located in the lower side of each of the central patterned portions PTP and the edge patterned portions PTE. Here, referring to FIG. 11, the distance on the basis of the uppermost corner of the center patterned portion PTP and the uppermost corner of the edge patterned portion PTE may be defined as 'w21', the distance at one point as 'w22', and the distance at the bottom point as 'w23'.

According to an embodiment, w11 may be formed in a range of about 300 μm, and w13 or w12 may be formed in a range of 100 μm to 180 μm. That is, the distance between the lower corners may be in a range of 0.3 times to 0.6 times the distance between their upper corners. The value of w13 or w12 may be determined based on the irradiation angle of the beam for forming the modified region. For example, when it is irradiated at 60 degrees, w13 or w12 may be formed at about 180 μm, and when it is irradiated at 45 degrees, w13 or w12 may be formed at 100 μm. This may be also applied to the cases of w21, w22, and w23.

According to an embodiment, as it goes farther from the center of the patterned window toward the edge thereof, at least one or all of the distance between the center patterned portion(s) PTP and/or the edge patterned portion(s) PTE, and the inclination of the inclined surface making up each of the patterned portions PTP and PTE may vary.

According to an embodiment, the distance between the center patterned portion PTPs may vary as it goes farther from the center of the patterned window toward the edge thereof. According to an embodiment, the distance between the center patterned portions PTP may increase or decrease as it goes farther from the center of the patterned window toward the edge thereof.

According to an embodiment, the distance between the center patterned portion PTP and the edge patterned portion PTE may be equal to or greater than the distance between the center patterned portions PTP. According to an embodiment, the distance between the center patterned portion PTP and the edge patterned portion PTE may be the same as the distance between the edge patterned portion PTE and its two sequentially neighboring center patterned portions PTP. According to an embodiment, the distance between the center patterned portion PTP and the edge patterned portion PTE may be formed to be greater than the distance between the edge patterned portion PTE and its two sequentially neighboring center patterned portions PTP.

According to an embodiment, the distance between the center patterned portions PTPs may be the same or different on the basis of the same height. According to an embodiment, the distance between the center patterned portion PTP and the edge patterned portion PTE may be the same or different on the basis of the same height.

According to an embodiment, the inclination of each inclined surface making up the center patterned portion PTP may vary as it goes further away from the center of the patterned window toward the edge thereof. According to an embodiment, the inclination of each inclined surface may be formed to make steeper inclination as it goes further away from the center of the patterned window toward the edge thereof. According to an embodiment, the inclination of each inclined surface may be formed to make more gentle inclination as it goes further away from the center of the patterned window toward the edge thereof.

According to an embodiment, the inclination of the inclined surface making up the edge patterned portion PTE may be formed to have the same inclination as that of the inclined surface of its facing center patterned portion PTP. According to an embodiment, the inclination of the inclined surface making up the edge patterned portion PTE may be formed to have a different inclination from the inclined surface of the facing center patterned portion PTP. According to an embodiment, the inclination of the inclined surface making up the edge patterned portion PTE may be formed to have a steeper inclination or more gentle inclination than the inclined surface of the facing center patterned portion PTP. Meanwhile, in an embodiment, a height h2 of the center patterned portion PTP and a height h1 of the edge patterned portion PTE may be formed to be the same as or different from each other. When the irradiation of the beam emitter is kept in the same method over the entire base window, the height h2 of the center patterned portion PTP and the height h1 of the edge patterned portion PTE may be designed to be the same, respectively, but the height h1 of the edge patterned portion PTE may be formed to be larger than the height h2 of the center patterned portion PTP, depending on the condition of the beam for forming the modified region (e.g., the irradiation angle of the beam).

As such, according to an embodiment of the disclosure, it is possible to utilize a larger area, when the patterned window is coupled to the upper and lower components with the adhesive member. Accordingly, it is possible to maintain a robust bonding in between the patterned window and other components. Further, since each corner of the patterned portion has a predetermined curvature, there is an advantage in that a boundary between the patterned portions is not visually identified when looking at the display module.

Meanwhile, the display module applied to an embodiment of the disclosure may be in-folded or out-folded as shown in FIGS. 12 to 15. According to an embodiment, the display module may include a window portion WDL and a display portion DPL disposed on a rear surface of the window portion WDL. Although not limited thereto, according to an embodiment, the display module may further include a function portion FCL1 and a protection portion FLC2. Although not limited thereto, the display module shown in FIGS. 12 to 15 may further include an additional layered component on its front or rear surface.

According to an embodiment, the window portion WDL and the display portion DPL may be arranged to cross at least a portion of the first housing structure (e.g., first housing structure 211 of FIG. 2A) and the second housing structure (e.g., second housing structure 212 of FIG. 2A).

According to an embodiment, the display module may include a reinforcing plate. According to an embodiment, the reinforcing plate (not shown) may be disposed on the rear surface of the display portion DPL. According to an embodiment, the reinforcing plate may include a first reinforcing plate facing the first housing structure and a second reinforcing plate facing the second housing. According to an embodiment, the window portion WDL, the display portion DPL, and the reinforcing plate may be attached to each other with an adhesive member (e.g., ADL). For example, the adhesive may include at least one of an optical clear adhesive (OCA), a pressure-sensitive adhesive (PSA), a heat-responsive adhesive, a general adhesive, or a double-sided tape.

Figure 12:
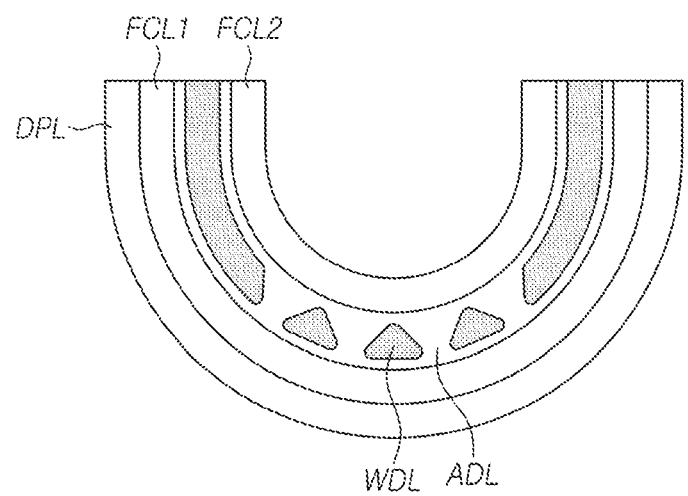
FIGS. 12, 13, 14, and 15 are views illustrating in-folding and out-folding states of a display module to which a patterned window is applied according to various embodiments of the disclosure.
Figure 13:
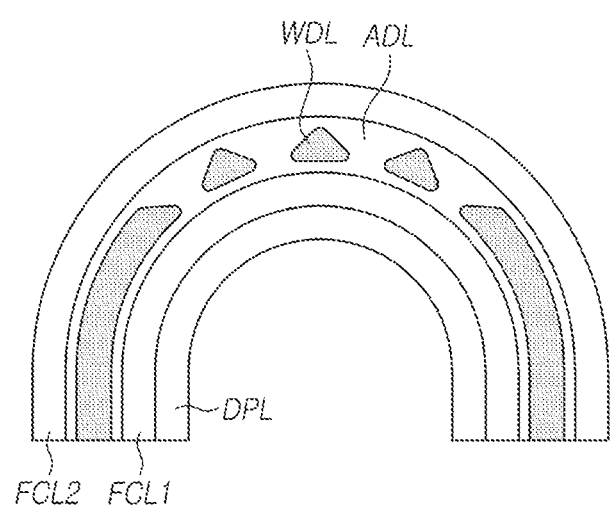

FIGS. 12 and 13 are views illustrating in-folding and out-folding states of the display module shown in FIG. 3A according to various embodiments of the disclosure. Referring to FIG. 12, the display module may be in-folded toward the front surface. Referring to FIG. 13, the display module may be out-folded toward the rear surface.

Figure 14:
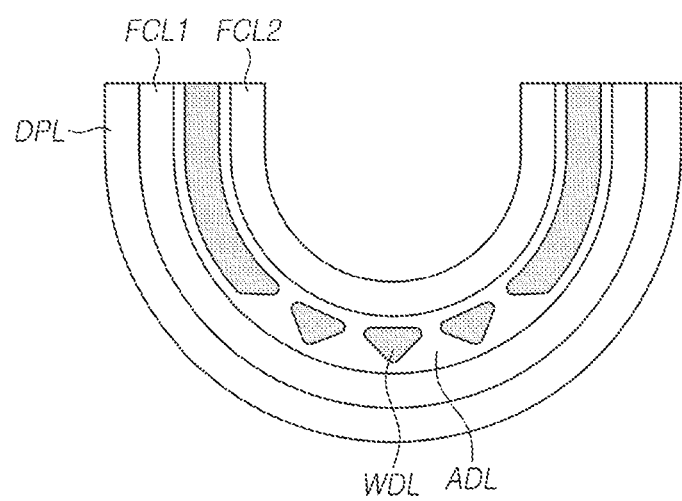
Figure 15:
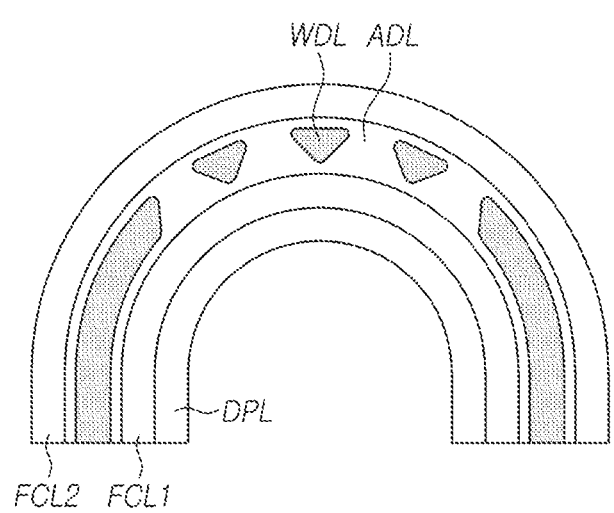

FIGS. 14 and 15 are diagrams illustrating in-folding and out-folding states of the display module shown in FIG. 3B according to various embodiments of the disclosure. Referring to FIG. 14, the display module may be in-folded toward the front surface. Referring to FIG. 15, the display module may be out-folded toward the rear surface. According to an embodiment, when the display module is in-folded or out-folded, the components directly or indirectly connected to the display module (e.g., housing(s), reinforcing plate(s)) may be simultaneously bent to correspond to bending of the display module.

The electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

The various embodiments and terms used herein are not intended to limit the technical features described herein to specific embodiments and should be understood to include various modifications, equivalents, or substitutes of the embodiment. In connection with the description of the drawings, like reference numerals may be used for similar or related components. In this document, each of the phrases such as "A or B," "at least one of A and B," "at least one of A or B," "A, B or C," "at least one of A, B and C," and "at least one of A, B, or C" may include any one of the items enumerated together in a corresponding one of the phrases, or all possible combinations thereof. Terms such as "the first," "the second," or "first," or "second" may be used simply to distinguish a corresponding component from another corresponding component, and do not limit the corresponding components in view of other aspect (e.g., importance or order). It is to be understood that if an element (e.g., a first element) is referred to, with or without the term "operatively" or "communicatively," as "coupled with," "coupled to," "connected with," or "connected to" another element (e.g., a second element), it denotes that the element may be coupled with the other element directly (e.g., wiredly), wirelessly, or via a third element.

The term "module" used in various embodiments of the document may include a unit implemented in hardware, software, or firmware and be used interchangeably with terms such as e.g., logic, logic block, part, component, or circuitry, for example. The module or unit may be a minimum unit or a part of the integrally configured component or the component that performs one or more functions. For example, according to an embodiment, the module or unit may be implemented in the form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply denotes that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities, and some of the multiple entities may be separately disposed in different components. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device including a flexible display,
   wherein the flexible display includes a patterned window, the patterned window comprising a plurality of patterned portions, and
   the plurality of patterned portions each having at least three corners having a predetermined curvature,
   wherein a first corner formed on an upper side of the patterned window by edge rounding has a first curvature,
   wherein a second corner formed on a lower side of the patterned window by edge rounding has a second curvature, the first curvature and the second curvature being different from each other, and
   wherein the patterned window includes a plurality of erasing portions vertically penetrating the patterned window, extending from the upper side of the patterned window to the lower side of the patterned window, and separating the plurality of patterned portions.

2. The electronic device of claim 1,
   wherein the flexible display is divided into a foldable area comprising the patterned portions and a flat area devoid of the patterned portions, and
   wherein the flat area and the foldable area form a plane having an angle of substantially 180 degrees in an unfolded state and face each other in substantially 0 degrees in a folded state.

3. The electronic device of claim 1,
   wherein the flexible display further includes a protective layer and one or more functional layers, and
   wherein the patterned window further includes an adhesive member for bonding the protective layer and the one or more functional layers.

4. The electronic device of claim 3, wherein the adhesive member at least partially surrounds the patterned window.

5. The electronic device of claim 3, wherein the adhesive member fully surrounds the patterned portions of the patterned window.

6. The electronic device of claim 1,
   wherein each patterned portion of the plurality of patterned portions includes a first inclined surface on one side and a second inclined surface on another side, and
   wherein the first inclined surface and the second inclined surface are connected to each other by a corner formed on an upper side of each of the patterned portions.

7. The electronic device of claim 6, wherein an inclination of the first inclined surface and the second inclined surface is determined based on an irradiation angle of a beam irradiated to form a patterned portion of the plurality of patterned portions.

8. The electronic device of claim 6, wherein the first inclined surface and the second inclined surface are symmetrical to each other.

9. The electronic device of claim 6, wherein the first inclined surface and the second inclined surface are asymmetrical to each other.

10. The electronic device of claim 1,
    wherein a distance between the patterned portions decreases from the first corner of a patterned portion of the plurality of patterned portions to a predetermined point, and wherein a distance between the patterned portions increases from the predetermined point to a bottom point to correspond to a second curvature formed in the second corner.

11. The electronic device of claim 10, wherein a height from a top end to the bottom point of a patterned portion of the plurality of patterned portions has a same height as an edge of the patterned window.

12. The electronic device of claim 10, wherein a height from a top end to the bottom point of a patterned portion of the plurality of patterned portions is smaller than a height of an edge of the patterned window.

13. The electronic device of claim 1, wherein a patterned portion of the plurality of patterned portions is made by a process of forming a modified region by irradiating laser obliquely to at least one region of the patterned window, and a wet etching process performed for the modified region.

14. The electronic device of claim 1, wherein the first corner has a curvature of 0.05 R or 0.02 R or greater.

15. The electronic device of claim 1, wherein a distance between second corners of the patterned portions is in a range of 0.3 times to 0.6 times a distance between first corners thereof.

16. The electronic device of claim 1, wherein a distance between the patterned portions becomes smaller as the second curvature of the second corner increases.

17. The electronic device of claim 1, wherein a distance between the patterned portions becomes smaller as the first curvature of the first corner decreases.

18. The electronic device of claim 1, wherein the second curvature decreases as the first curvature increases.

19. The electronic device of claim 1, wherein in at least a portion of the patterned window, two patterned portions, of the plurality of patterned portions are spaced apart in a first direction, extending in a second direction.

20. The electronic device of claim 19, wherein when the patterned window is viewed in a third direction perpendicular to the first and second directions, at least a portion of the patterned window is patterned in a clamp shape, and another portion is patterned in a zigzag shape.

21. The electronic device of claim 1, wherein each of the plurality of erasing portions comprises a trench, a recess, or a hole vertically penetrating the patterned window.

* * * * *